United States Patent
Hynecek et al.

(10) Patent No.: US 9,888,197 B1
(45) Date of Patent: Feb. 6, 2018

(54) METHODS AND APPARATUS FOR A CMOS IMAGE SENSOR WITH AN IN-PIXEL AMPLIFIER

(71) Applicant: SEMICONDUCTOR COMPONENTS INDUSTRIES, LLC, Phoenix, AZ (US)

(72) Inventors: Jaroslav Hynecek, Allen, TX (US); Jeffery Steven Beck, Philomath, OR (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/398,137

(22) Filed: Jan. 4, 2017

(51) Int. Cl.
| | |
|---|---|
| *H04N 5/3745* | (2011.01) |
| *H04N 5/378* | (2011.01) |
| *H04N 5/353* | (2011.01) |
| *H01L 27/146* | (2006.01) |

(52) U.S. Cl.
CPC ..... *H04N 5/37457* (2013.01); *H01L 27/1464* (2013.01); *H01L 27/14621* (2013.01); *H01L 27/14627* (2013.01); *H01L 27/14634* (2013.01); *H01L 27/14641* (2013.01); *H01L 27/14645* (2013.01); *H04N 5/3532* (2013.01); *H04N 5/378* (2013.01)

(58) Field of Classification Search
CPC .... H04N 5/3532; H04N 5/3559; H04N 5/363; H04N 5/3658; H04N 5/357; H04N 5/378; H04N 5/376; H01L 27/14636; H01L 27/14616; H01L 27/14634; H01L 27/14643; H01L 27/14607; H01L 27/14609
See application file for complete search history.

(56) References Cited

U.S. PATENT DOCUMENTS

| | | | |
|---|---|---|---|
| 2003/0164443 A1 | 9/2003 | Henderson | |
| 2007/0007437 A1 | 1/2007 | Olsen | |
| 2008/0309800 A1* | 12/2008 | Olsen | H04N 5/357 348/241 |
| 2012/0147237 A1* | 6/2012 | Xu | H01L 27/14609 348/301 |
| 2014/0027639 A1 | 1/2014 | Yang | |
| 2014/0375855 A1* | 12/2014 | Nishihara | H01L 27/14603 348/301 |
| 2015/0163438 A1* | 6/2015 | Anjyou | H04N 5/3742 250/208.1 |
| 2015/0172573 A1* | 6/2015 | Wang | H04N 5/363 250/208.1 |
| 2016/0225803 A1* | 8/2016 | Korobov | H01L 27/1464 |

* cited by examiner

*Primary Examiner* — Kelly L Jerabek
(74) *Attorney, Agent, or Firm* — The Noblitt Group, PLLC; Hettie L. Haines

(57) ABSTRACT

Various embodiments of the present technology may comprise a method and apparatus for an image sensor. The image sensor may be configured as a stacked image sensor with two or more chips stacked vertically. The image sensor may comprise a plurality of pixel circuits, wherein portions of the pixel circuit are arranged on separate chips. Each pixel circuit may comprise an amplifier with a first feedback network to increase the sensor sensitivity, to reduce noise in the pixel signal, and to reduce the voltage swing on the FD node. Each pixel circuit may further comprise a second feedback network to stabilize the common-mode voltage of the pixel signal amplifier.

20 Claims, 4 Drawing Sheets

METHODS AND APPARATUS FOR A CMOS IMAGE SENSOR WITH AN IN-PIXEL AMPLIFIER

BACKGROUND OF THE TECHNOLOGY

Figure 1:
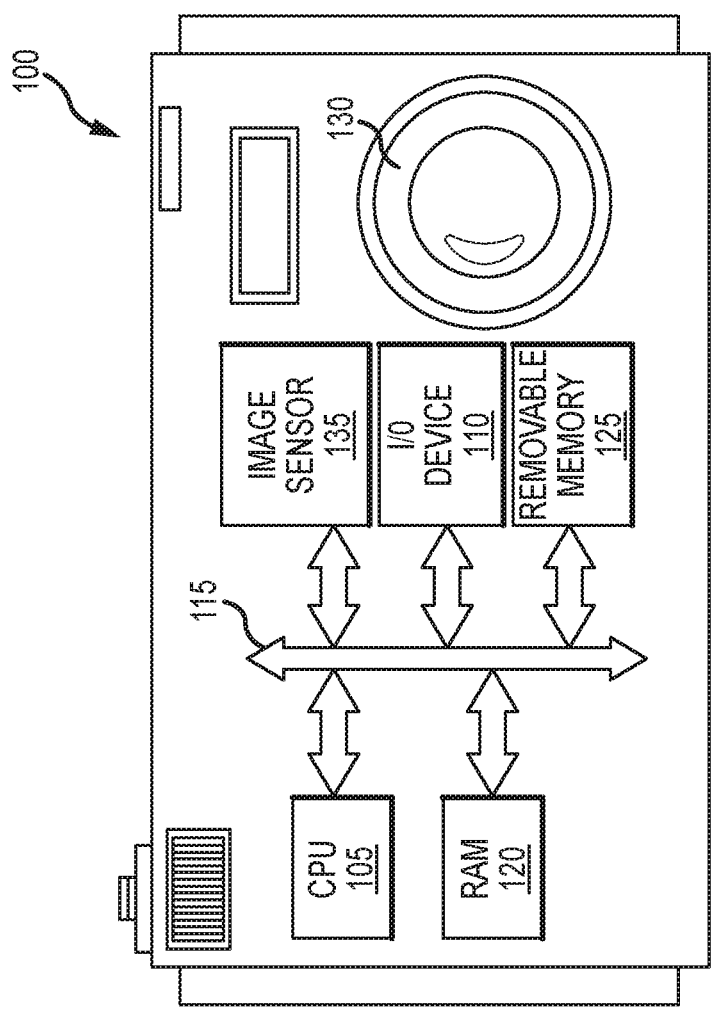

Electronic devices, such as cellular telephones, cameras, and computers, commonly use image sensors to capture images. A typical CMOS (complementary metal-oxide-semiconductor) imager circuit includes a focal plane array of pixels, and each pixel includes a photo-sensor, such as a photogate, or photodiode, for accumulating photo-generated charge in a portion of the substrate. Each pixel has a charge storage region, formed in the substrate. The charge storage region may be constructed as a floating diffusion region. In some imager circuits, each pixel may include at least one electronic device, such as a transistor, for transferring charge from the photo-sensor to the storage region, a second device, also typically a transistor, for resetting the charge storage region to a predetermined bias level prior to charge transference, and a third device for amplification or buffering of the signal prior to connection to a readout line.

In a CMOS imager with charge integrating pixels or pixels that operate in integrating mode, the active elements of a pixel perform the necessary functions of: (1) photon to charge conversion; (2) accumulation of image charge; (3) transfer of charge to the storage region; (4) selection of a pixel for readout; (5) output and amplification of a signal, and (6) resetting the storage region to a known state representing a reset level Many conventional high-performance image sensors are described by one or more specifications, such as high resolution, high dynamic range, high speed, low noise, low dark current, no image lag, charge storage capacity, output voltage swing, etc. While some of the specifications are interrelated, some are trade-offs due to the physical properties and the design of the image sensor. For example, conventional image sensors may utilize a source follower transistor to buffer the charge generated voltage at the storage region to a pixel output voltage. The source follower transistor, however, adds noise to the signal without increasing the gain of the signal. Other considerations may include the pixel size of the image sensor, as smaller image sensors are preferred for various electronic devices, and/or the cost to fabricate the image sensor.

SUMMARY OF THE INVENTION

Various embodiments of the present technology may comprise a method and apparatus for an image sensor. The image sensor may be configured as a stacked image sensor with two or more chips stacked vertically. The image sensor may comprise a plurality of pixel circuits, wherein portions of the pixel circuit are arranged on separate chips. Each pixel circuit may comprise an amplifier with a first feedback network to increase the sensor sensitivity, to reduce noise in the pixel signal, and to reduce the voltage swing on the FD node. Each pixel circuit may further comprise a second feedback network to stabilize the common-mode voltage of the pixel signal amplifier.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 2:
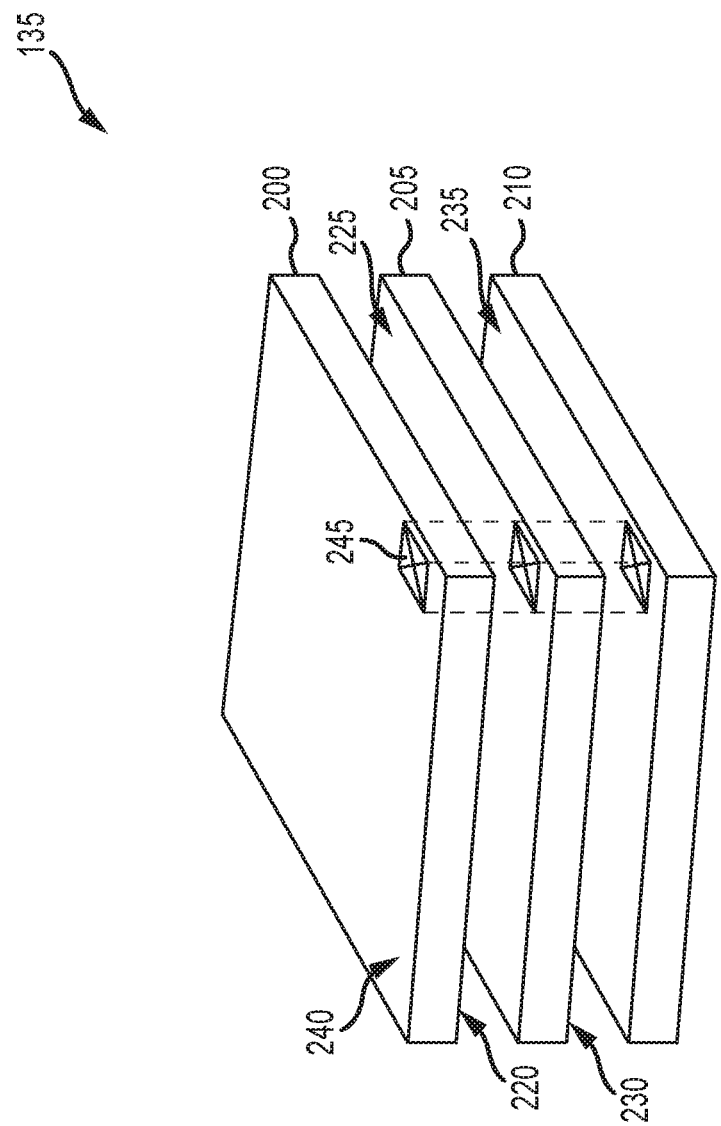
Figure 3:
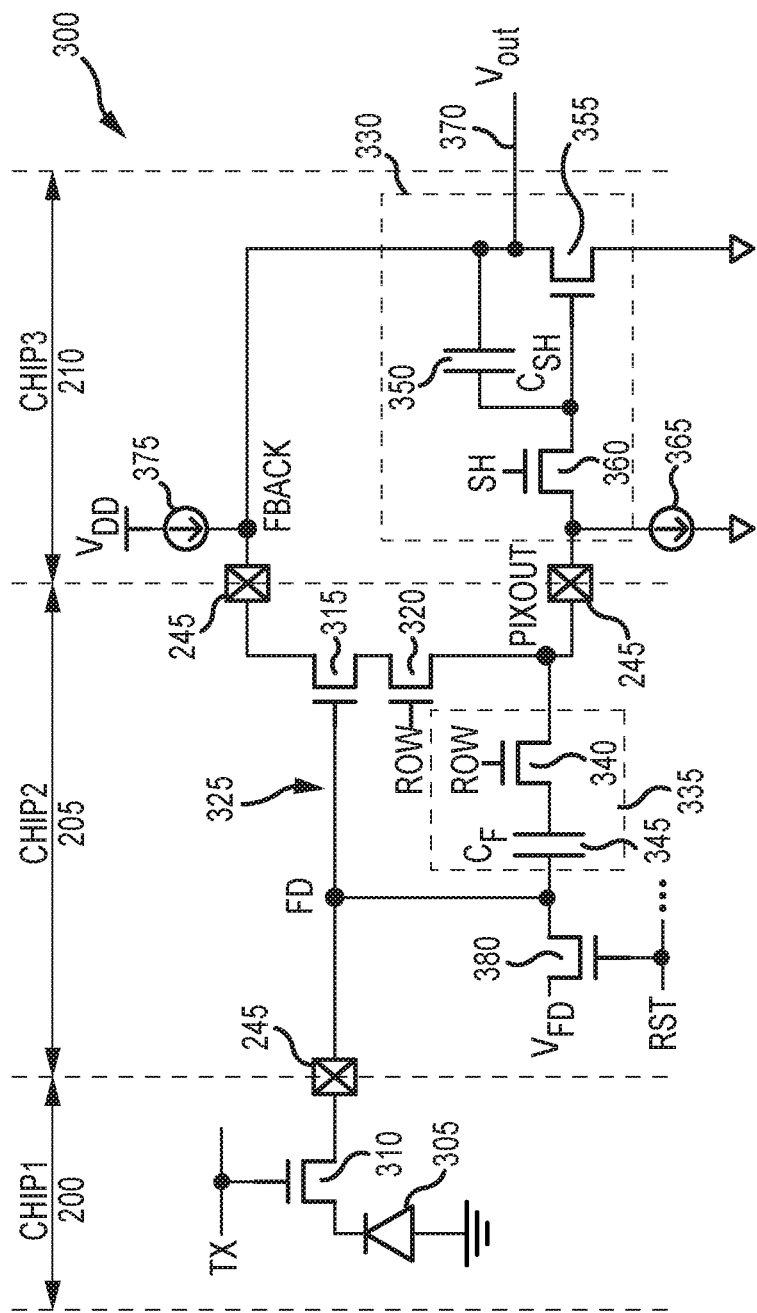
Figure 4:
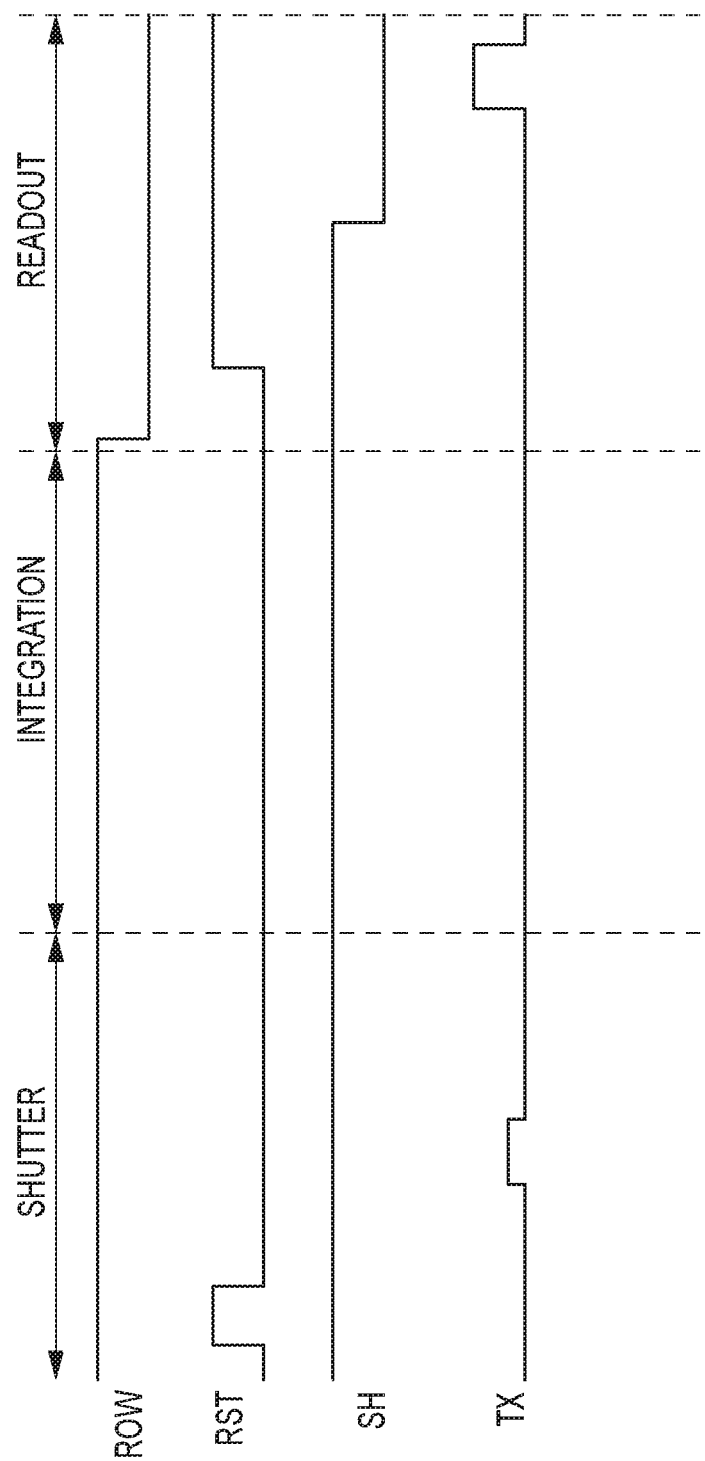

FIG. 1 representatively illustrates an imaging system in accordance with an exemplary embodiment of the present technology;

FIG. 2 representatively illustrates an exploded view of a stacked chip image sensor in accordance with an exemplary embodiment of the present technology;

FIG. 3 is a circuit diagram of an image sensor pixel in accordance with an exemplary embodiment of the present technology; and FIG. 4 is a timing diagram for an image sensor pixel circuit in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various sampling circuits, analog-to-digital converters, semiconductor devices such as transistors, capacitors, image processing units, and the like, which may carry out a variety of functions. In addition, the present technology may be practiced in conjunction with any number of systems, such as automotive, aerospace, imaging, and consumer electronics, and the systems described are merely exemplary applications for the technology. Further, the present technology may employ any number of conventional techniques for capturing image data, sampling image data, processing image data, and the like.

Methods and apparatus for an image sensor with an in-pixel amplifier according to various aspects of the present technology may operate in conjunction with any suitable electronic system, such as imaging systems, "smart devices," wearables, consumer electronics, and the like. Further, methods and apparatus for the image sensor may be utilized with any suitable imaging system, such as a camera system, video system, machine vision, vehicle navigation, surveillance system, motion detection system, and the like.

Referring to FIG. 1, an exemplary imaging system may comprise an electronic device, such as a digital camera 100. In one embodiment, the imaging system may comprise a central processing unit (CPU) 105 that communicates with various devices over a bus 115. Some of the devices connected to the bus 115 may provide communication into and out of the system, for example an input/output (I/O) device 110. Other devices connected to the bus 115 provide memory, for example a random access memory (RAM) 120, hard drive, and one or more peripheral memory devices 125, such as a USB drive, memory card, and SD card. While the bus 115 is illustrated as a single bus, any number of busses may be used to provide communication paths to interconnect the devices.

The imaging system may further comprise an image sensor 135 for capturing image data. For example, light may enter the imaging system through a lens 130 and strike the image sensor 135. The image sensor 135 may comprise an array of pixels to detect the light and convey information that constitutes an image by converting the variable attenuation of waves (as they pass through or reflect off object) into electrical signals. The image sensor 135 may be implemented in conjunction with any appropriate technology, such as active pixel sensors in CMOS technology. In various embodiments, the lens 130 may be configured to focus an image on the image sensor 135. For example the lens 130 may include a fixed and/or adjustable focus lens.

In various embodiments, the image sensor 135 may utilize chip stacking. For example, referring to FIGS. 2 and 3, the image sensor 135 may comprise a first chip 200, a second chip 205, and a third chip 210, wherein the first, second and third chips 200, 205, 210 are electrically coupled, and wherein the chips 200, 205, 210 are stacked vertically, such that a second major surface 220 of the first chip 200 and a first major surface 225 of the second chip 205 are adjacent or proximate each other in the vertical stack, and a second major surface 230 of the second chip 205 and a first major surface 235 of the third chip 210 are adjacent or proximate to each other in the vertical stack.

In an exemplary embodiment, each pixel circuit 300 may be formed across multiple chips, such as all three chips 200, 205, 210, wherein a portion of the pixel circuit 300 is formed in each chip. The chips 200, 205, 210 may be electrically connected utilizing various electrical interconnects 245 formed in each chip. The electrical interconnects 245 may be formed using conventional techniques. For example, vias may be formed using various etching techniques and then filled with a metal, such as tungsten. The vias may be electrically coupled to various metal layers (not shown) within each chip. The electrical interconnects 245 in each chip may be bonded together such that the electrical interconnects 245 couple various circuits formed on each chip.

Various chips of the image sensor 135 stack may be bonded together using various bonding techniques. For example, hybrid bonding may be used to create connections between circuits and/or devices within one pixel circuit 300. Hybrid bonding may be preferred in embodiments where the image sensor 135 is a backside illumination sensor. Fusion bonding may be utilized to bond the second major surface 230 of the second chip 205 to the first major surface 235 of the third chip 210. Fusion bonding adheres the two surfaces of the chips together as a result of chemical bonds established between molecules from the two surfaces, such as during a high temperature thermal annealing.

In various embodiments, the first chip 200 may include a photosensor to detect light and convert the detected light into a charge representing a pixel signal. The first chip 200 may be configured to store the charge according to various system operations, such as rolling shutter operations or global shutter operations. The first chip 200 may comprise any suitable device to convert photons to a charge. For example, the first chip 200 may comprise a plurality of photodetectors 305, wherein each pixel circuit 300 may comprise one or more photodetectors 305.

The photodetector 305 converts light into an electric charge. The photodetectors 305 may be arranged in rows and columns, or other suitable formation, to form an array. The photodetector 305 may comprise, for example, a photodiode, a photogate, or any other appropriate device responsive to light. In an exemplary embodiment, the photodetector 305 comprises a pinned photodiode.

The first chip 200 may further comprise a transfer gate 310 to transfer charge from the photodetector 305 to a charge storage region (e.g., a floating diffusion node FD). The transfer gate 310 may comprise any suitable device to selectively couple the photodetector to the FD, for example the transfer gate 310 may comprise a transistor having a gate terminal, a drain terminal, and a source terminal. The transfer gate 310 may be responsive to a transfer signal TX. For example, the transfer gate 310 may open and close according to the transfer signal TX applied to the gate terminal of the transfer gate 310.

In various embodiments, the image sensor 135 may comprise a color filter system (not shown), such as a color filter array (CFA), to filter impinging light according to wavelength. The CFA may comprise a pattern of color filters situated on the first chip 200 to capture color information. In the exemplary embodiment, each photodetector 300 is covered with one color of the CFA. For example, a Bayer color filter array comprising a pattern of red, blue, and green filters may be provided, wherein each photodetector 300 is covered with one of a red, blue, or green filter. In other embodiments, the CFA may be formed using other color filters, such as a CYYM filter (one cyan, two yellow, and one magenta), a CYGM filter (one cyan, one yellow, one green, and one magenta), a CRGB filter (one cyan, one red, one green, and one blue), and any other suitable color pattern. In various embodiments, the CFA may comprise "clear" or transparent filter elements. The CFA may form a 2×2 color pattern, a 4×4 color pattern, a 2×4 color pattern, or any other suitable pattern size. In various embodiments, the CFA may repeat to cover the entire photodetector array, and may be disposed on a first major surface 240 of the first chip 200.

In various embodiments, the image sensor 135 may further comprise a microlens array (not shown) formed by a plurality of microlenses disposed on the first major surface 240 of the first chip 200 to help focus light on the photodetectors 300. The size and type of the microlenses may be selected for a particular application, and may be formed using conventional fabrication techniques and methods.

The second chip 205 may perform various in-pixel operations, such as pixel signal amplification and pixel signal readout operations. In various embodiments, the second chip 205 may enhance the performance of the image sensor 135 by minimizing the voltage swing on the floating diffusion node, which allows the pinning voltage of the photodetector 300 to be higher relative to the power supply voltage $V_{DD}$, thus increasing the charge storage capacity of the photodetector 300. In an exemplary embodiment, the second chip 205 may comprise a first circuit 325 coupled to the photodetector 300 to receive one or more pixel signals via hybrid bonds and/or various electrical interconnects 245.

In various embodiments, the first circuit 325 may amplify the pixel signal, reduce noise in the pixel signal, and to reduce the voltage swing on the FD node. Reducing the voltage swing the FD node may increase the charge storage capacity of the photodetector 300, thus increasing the dynamic range of the image sensor 135. The first circuit 325 may comprise a first feedback network 335 to isolate the FD node from the pixel output node PIXOUT and/or reduce the voltage swing the FD node. In an exemplary embodiment, the first circuit 325 may comprise a first amplifying device 315, a first row select device 320, a second row select device 340, and a first charge storage device 345.

The first amplifying device 315, such as a transistor, may amplify the pixel signal. The size and type of the first amplifying device 315 may be selected according to a particular design. For example the first amplifying device 315 may comprise a PMOS transistor or an NMOS transistor. In an exemplary embodiment, the first amplifying device 315 comprises a PMOS transistor having a gate terminal, a drain terminal, and a source terminal.

The first circuit 325 may further comprise a first row select device 320 and a second row select device 340 to selectively couple the FD node, and the corresponding pixel signal, within a particular row to a pixel output node PIXOUT. The row select devices 320, 340 may comprise any suitable devices to facilitate the transfer of a signal, such as a transistor. In an exemplary embodiment, the first row select device 320 is cascaded with the first amplifying device 315. For example, the first row select device 320 may operate as a switch that can be activated to connect the drain of amplifying transistor 315 to the pixel output node PIXOUT. When the first row select device 320 is activated, it operates as a cascode device, which enhances the open-loop gain of the first amplifying device 315. When the first row select device 320 is deactivated, it isolates the first amplifying device 315 from the pixel output node PIXOUT, thus reducing the capacitive load on the pixel output node PIXOUT.

Similarly, the second row select device 340 may operate as a switch that can be activated (closed) to connect the FD node to the pixel output node PIXOUT, or deactivated (open) to disconnect the FD node from the pixel output node PIXOUT. When the second row select device 340 is activated, the feedback loop is capable of transmitting a signal. Alternatively, when the second row select device 340 is deactivated, the first charge storage device 345 and the FD node are isolated from the pixel output node PIXOUT, which reduces the capacitive load on the pixel output node PIXOUT. In an exemplary embodiment, each row select device 320, 340 may comprise a transistor having a gate terminal, a drain terminal, and a source terminal, wherein the transistor is responsive to a row signal ROW.

The first circuit 325 may comprise a first feedback network 335 to reduce noise in the pixel signal, such as kTC noise and random telegraph signal noise, and to reduce the voltage swing on the FD node. The first feedback network 335 may comprise any suitable components to operate as a negative feedback network and/or to electrically isolate various nodes in the image sensor 135. For example, the first feedback network 335 may selectively couple the pixel output node PIXOUT to the FD node through the first charge storage device 345 to create a first feedback loop capable of transmitting a portion of the signal at the pixel output node PIXOUT back to the FD node. In various embodiments, the first feedback network 335 may comprise the second row select device 340 to selectively couple the pixel output node to the FD node by opening or closing the first feedback loop.

The first feedback network 335 may further comprise the first charge storage device 345 to provide a feedback factor representing a percentage of the pixel signal on the pixel output node PIXOUT. The feedback factor may be subtracted from the pixel signal at the FD node to minimize the voltage swing of the FD node. For example, the first charge storage device 345 may comprise a feedback capacitor having a variable capacitance $C_F$. In an exemplary embodiment, the first charge storage device 345 reduces the voltage swing of the FD node to a value equal to the output swing of the pixel output node PIXOUT divided by the gain of the first amplifying device 315.

The first circuit 325 may further comprise a reset device 380 to reset the FD node and/or to set the common-mode voltage of the first amplifying device 315. The reset device 380 may be responsive to a signal, such as a reset signal RST. For example, the reset device 380 may couple a global voltage $V_{FD}$ to the FD node. The voltage on the FD node when the global voltage is coupled to the FD node corresponds to the common-mode voltage of the first amplifying device 315. The reset device 380 may comprise any suitable device responsive to a signal and capable of coupling the global voltage to the FD node. For example, in an exemplary embodiment, the reset device 380 comprises a transistor having a gate terminal, a drain terminal, and a source terminal, wherein the gate terminal receives the reset signal RST.

The third chip 210 may perform various processing and readout operations. For example, the third chip 210 may comprise a microprocessor, an application-specific integrated circuit (ASIC), or the like. In various embodiments, the third chip 210 may comprise column circuitry, and a timing and control unit, for selectively activating sequential readout of electrical signals. The third chip 210 may comprise an image signal processor to perform various signal processing functions, such as demosaicing, autofocus, noise reduction, white balance, and the like. The third chip 210 may comprise any number of devices, such as transistors, capacitors, and like for performing calculations, transmitting and receiving image data, and a storage unit for storing image data.

The third chip 210 may further comprise one or more current sources. For example, the third chip 210 may comprise a first current source 375 to set the common-mode voltage of the first amplifying device 315. The first current source 375 may be coupled between the supply voltage $V_{DD}$ and the first amplifying device 315. The third chip 210 may further comprise second current source 365 to operate as a bias load. The second current source 365 may be coupled to the pixel output node PIXOUT.

The third chip 210 may comprise a second feedback network 330 to stabilize the common-mode voltage of the first amplifying device 315. The second feedback network 330 may couple the pixel output node PIXOUT to a feedback node FBACK, wherein the feedback node FBACK is coupled to the first amplifying device 315, for example, the source terminal. The second feedback network 330 may produce a current and selectively couple the pixel output node PIXOUT to the feedback node FBACK to hold the feedback node FBACK at a fixed voltage. For example, the second feedback network 330 may comprise a second amplifying device 355, a second charge storage device 350, and a switch 360.

The switch 360 may be responsive to a signal, for example a sample and hold signal SH, and configured to selectively couple the pixel output node PIXOUT to the feedback node FBACK. The switch 360 may comprise any suitable device for selectively coupling the pixel output node PIXOUT to the feedback node FBACK to create a second feedback loop. For example, the switch 360 may comprise a transistor having a gate terminal, a drain terminal, and a source terminal, wherein the gate terminal receives the sample and hold signal SH, and the switch 360 operates (opens or closes) according to the signal.

The second amplifying device 355 may ensure that the feedback node FBACK maintains a fixed predetermined voltage. The second amplifying device 355 may be coupled to the switch 360 and the feedback node FBACK. The second amplifying device 355 may comprise a transistor, such as common source amplifier having a gate terminal, a source terminal, and a drain terminal. The gate terminal may be coupled to the switch 360, wherein when the switch 360 is activated (closed), current flows through the second amplifying device 355 and responds in a way that keeps the feedback node FBACK at the fixed predetermined voltage. The second amplifying device 355 may operate in conjunction with the first current source 375 to set the common-mode voltage of the first amplifying device 315.

The second charge storage device 350 may store charge to stabilize the feedback node FBACK. The second charge storage device 350 may comprise any suitable device for storing charge, such as a capacitor. The second charge storage device 350 may be coupled between the gate of the second amplifying device 355 and the feedback node FBACK, and between the switch 360 and the feedback node FBACK. For example, during operation, the second charge storage device 350 may couple the voltage at the feedback node FBACK to the gate of amplifying device 355 to stabilize the feedback node FBACK when the switch 360 is open.

In operation, the image sensor 135 may convert photons to charge, transfer the charge to a storage region, amplify the charge signal (pixel signal), readout the pixel signal, and convert the pixel signal to a pixel output voltage. For example, and referring to FIGS. 2, 3, and 4, the image sensor 135 may perform various operations during a shutter period, integration, and readout.

During the shutter period, while the row select devices are deactivated, the reset device 380 is activated to couple the floating diffusion node to the global voltage $V_{FD}$. After the reset device 380 has been activated, the transfer gate 310 may receive the transfer signal TX to deplete the photodetector 305 of all free electrons. This operation resets the photodetector 305 and prepares the pixel for integration. The transfer gate 310 may receive a partial step transfer signal TX to lower the voltage swing on the transfer gate 310, which lowers the feed-through from the transfer gate 310 to the FD node. This operation may be beneficial for the circuit operation, as the transfer gate 310 is typically biased by a considerable negative bias in order to accumulate holes under the gate and minimize the generation of dark current under this gate. The partial step transfer signal TX eliminates this bias and prepares the gate for the charge transfer at a later time.

During integration, the photodetectors 305 may convert incoming light to charge and collect the charge for a predetermined period of time. During integration, the first row select device 320 and the second row select device 340, each of which receive the row signal ROW, remain deactivated (open) to inhibit current flow though the first amplifying device 315. The second row select device 340 further prevents the pixel output node PIXOUT disturbances from propagating to the FD node when a different row of pixels are being read out.

During readout, the first row select device 320 and the second row select device 340 are activated while the switch 360 is activated. This places the global voltage $V_{FD}$ on the floating diffusion node and creates the second feedback loop from the pixel output node PIXOUT to the feedback node FBACK. The second feedback loop forces the pixel output node PIXOUT to a reset voltage Vgsn. The reset device 380 is then deactivated to store charge on the FD node. After the reset device 380 is deactivated, the switch 360 is deactivated to break the second feedback loop and set the feedback node FBACK to a predetermined voltage. At this time, any charge entering or leaving the FD node results in a voltage change at the pixel output node PIXOUT and is transmitted via a pixel output line 370 as an output voltage Vout. At the end of the predetermined period of time, the transfer gate 310 may receive the transfer signal TX to transfer charge from the photodetector 305 to the floating diffusion node. The transfer gate 310 may be pulsed again to add additional charge to the FD node.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:
1. An image sensor, comprising:
an array of photodetectors configured to generate charge in response to light; wherein
the charge is selectively transferred to a floating diffusion node;
a first amplifier coupled to a pixel output node and a feedback node and responsive to the charge stored in the floating diffusion node and configured to produce a pixel signal at the pixel output node,
wherein the first amplifier has a gain greater than unity;
a first row select device coupled between the drain terminal of the first amplifier and the pixel output node and responsive to a first signal;
a first feedback network adapted to selectively couple the pixel output node to the floating diffusion node; and
a second feedback network adapted to selectively couple the pixel output node to the feedback node.

2. The image sensor according to claim 1, wherein the first feedback network comprises:
a first capacitor; and
a second row select device coupled to the first capacitor, wherein the second row select device is responsive to the first signal and selectively couples the pixel output node to the floating diffusion node.

3. The image sensor according to claim 1, further comprising a second row select device responsive to a second signal to selectively couple the pixel output node to the floating diffusion node.

4. The image sensor according to claim 1, further comprising a reset transistor coupled to a voltage source and the floating diffusion node, and responsive to a reset signal to remove charge from the floating diffusion node.

5. The image sensor according to claim 1, further comprising:
a current source coupled to the feedback node, wherein the current source is configured to set a voltage level of the feedback node; and
a bias current coupled to the pixel output node, wherein the bias current is configured to load the first amplifier.

6. The image sensor according to claim 1, further comprising a first transfer gate responsive to a second signal and coupled to at least one of the photodetectors, wherein the first transfer gate is configured to transfer charge to the floating diffusion node.

7. The image sensor according to claim 1, wherein the second feedback network comprises:
a second amplifier responsive to a voltage potential at the pixel output node and coupled to the feedback node; and
a second capacitor coupled between the feedback node and the pixel output node.

8. The image sensor according to claim 1, wherein the image sensor is configured as a backside illuminated image sensor.

9. The image sensor according to claim 1, wherein the image sensor is configured as a stacked image sensor comprising:
a first chip, wherein the first chip comprises the array of photodetectors;
as second chip, wherein the second chip comprises the first feedback network;
a third chip, wherein the third chip comprises the second feedback network;
wherein:
the first chip and second chip are bonded together with a hybrid bond; and
the second chip and third chip are bonded together with a fusion bond.

10. A method for forming an image sensor, comprising:
forming an array of photodetectors;
forming a first circuit comprising:
a floating diffusion region coupled to at least one photodetector;
a first amplifier with a gain greater than unity;
a pixel output node;
a first feedback circuit;
wherein:
the feedback circuit couples the pixel output node to the floating diffusion region; and
the first circuit is coupled to a feedback node; and
forming a second circuit, coupled to the first circuit at the pixel output node and the feedback node, comprising:
a second feedback circuit, comprising a second amplifier, wherein the second feedback circuit is adapted to selectively couple the pixel output node to the feedback node.

11. The method for forming an image sensor according to claim 10, further comprising:
coupling a current source to the feedback node; and
coupling a bias current to the pixel output node.

12. The method for forming an image sensor according to claim 10, further comprising
forming a first chip wherein:
the first chip comprises the array of phototdetectors; and
the array of photodetectors form a backside illuminated sensor.

13. The method for forming an image sensor according to claim 12, further comprising
forming a second chip, wherein the second chip comprises the first circuit; and
forming a third chip, wherein the third chip comprises the second circuit.

14. The method for forming an image sensor according to claim 13, further comprising
forming a stacked image sensor with the first, second, and third chips by bonding a major surface of the first chip to a first major surface of the second chip, and bonding a second major surface of the second chip to a major surface of the third chip.

15. The method for forming an image sensor according to claim 14, wherein:
bonding the first chip to the second chip comprises hybrid bonding; and
bonding the second chip to the third chip comprises fusion bonding.

16. An imaging system, comprising:
an image sensor, comprising:
a first chip, comprising:
an array of photodetectors; and
a first transfer gate responsive to a first signal and coupled to at least one photodetector, wherein the first transfer gate is configured to transfer charge out of the photodetector;
a second chip coupled to the first chip, comprising:
a charge storage node coupled to one or more photodetectors and configured to store charge generated by one of the photodetectors; and
a first amplifier responsive to the charge at the charge storage node, and configured to produce a pixel signal at a pixel output node, comprising:
a first terminal coupled to the first transfer gate;
a second terminal coupled to the pixel output node;
a third terminal coupled to a feedback node; and
wherein the first amplifier has a gain greater than unity;
a first row select device coupled between the second terminal of the first amplifier and the pixel output node and responsive to a second signal; and
a first feedback network coupled between the pixel output node and the charge storage node, comprising:

a first capacitor coupled between the pixel output node and the first terminal of the first amplifier; and a second row select device coupled between the pixel output node and the first terminal of the first amplifier and responsive to the second signal; and a third chip coupled to at least the second chip, comprising:

a third transfer gate responsive to a third signal and coupled between the second amplifier and the pixel output node; and a second feedback network coupled between third transfer gate and the feedback node, comprising:

a second amplifier comprising:

a first terminal coupled to the feedback node;

a second terminal coupled to the third transfer gate; and a second capacitor coupled between the feedback node and the second terminal of the second amplifier.

17. The imaging system according to claim 16, wherein the second chip further comprises a reset transistor coupled to a voltage source and the charge storage region, and responsive to a reset signal to remove charge from the charge storage node.

18. The imaging system according to claim 16, further comprising a current source coupled to the feedback node and a bias current coupled to the pixel output node.

19. The imaging system according to claim 16, wherein:

the first chip and second chip are bonded together with hybrid bonds; and the second chip and third chip are bonded together with a fusion bond.

20. The imaging system according to claim 16, wherein:

the image sensor is configured as a backside illuminated image sensor; and the first, second, and third chips are stacked vertically.

* * * * *